(12) United States Patent
Kim et al.

(10) Patent No.: US 11,437,295 B2
(45) Date of Patent: Sep. 6, 2022

(54) SEMICONDUCTOR PACKAGE AND ELECTRONIC DEVICE HAVING THE SAME

(71) Applicant: Samsung Electro-Mechanics Co., Ltd., Suwon-si (KR)

(72) Inventors: Tae Hyun Kim, Suwon-si (KR); Jung Hyun Lim, Suwon-si (KR); Seung Goo Jang, Suwon-si (KR); Eun Kyoung Kim, Suwon-si (KR); Se Min Jin, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/823,791

(22) Filed: Mar. 19, 2020

(65) Prior Publication Data

US 2020/0219784 A1 Jul. 9, 2020

Related U.S. Application Data

(63) Continuation of application No. 15/832,807, filed on Dec. 6, 2017, now Pat. No. 10,636,721.

(30) Foreign Application Priority Data

Aug. 16, 2017 (KR) .................. 10-2017-0103390

(51) Int. Cl.
*H01L 23/367* (2006.01)
*H01L 23/31* (2006.01)
(Continued)

(52) U.S. Cl.
CPC ........ *H01L 23/367* (2013.01); *H01L 23/3107* (2013.01); *H01L 23/3672* (2013.01);
(Continued)

(58) Field of Classification Search
None
See application file for complete search history.

(56) References Cited

U.S. PATENT DOCUMENTS

| 5,726,079 A | 3/1998 | Johnson |
| 5,990,550 A | 11/1999 | Umezawa |

(Continued)

FOREIGN PATENT DOCUMENTS

| CN | 1554120 A | 12/2004 |
| CN | 1638105 A | 7/2005 |

(Continued)

OTHER PUBLICATIONS

Chinese Office Action dated Nov. 18, 2021 in counterpart Chinese Patent Application No. 201810115945.6 (14 pages in English, 10 pages in Chinese).

(Continued)

*Primary Examiner* — Telly D Green
(74) *Attorney, Agent, or Firm* — NSIP Law

(57) ABSTRACT

A semiconductor package includes a substrate including an antenna; a heating element disposed on a first surface of the substrate and connected to the antenna; a heat radiating part coupled to the heating element; and a signal transfer part disposed on the first surface of the substrate and configured to electrically connect the substrate to a main substrate. The heat radiating part may include a heat transfer part connected to the heating element and heat radiating terminals connecting the heat transfer part and the main substrate to each other.

15 Claims, 7 Drawing Sheets

(51) Int. Cl.
  *H01L 23/433* (2006.01)
  *H01L 23/498* (2006.01)
  *H01L 23/538* (2006.01)
  *H01L 23/00* (2006.01)
  *H01L 23/66* (2006.01)

(52) U.S. Cl.
  CPC ...... *H01L 23/3677* (2013.01); *H01L 23/4334* (2013.01); *H01L 23/49811* (2013.01); *H01L 23/5389* (2013.01); *H01L 23/66* (2013.01); *H01L 24/17* (2013.01); *H01L 23/3128* (2013.01); *H01L 24/16* (2013.01); *H01L 24/29* (2013.01); *H01L 24/32* (2013.01); *H01L 24/73* (2013.01); *H01L 24/83* (2013.01); *H01L 24/92* (2013.01); *H01L 2223/6677* (2013.01); *H01L 2224/16227* (2013.01); *H01L 2224/291* (2013.01); *H01L 2224/2919* (2013.01); *H01L 2224/32225* (2013.01); *H01L 2224/32245* (2013.01); *H01L 2224/73204* (2013.01); *H01L 2224/73253* (2013.01); *H01L 2224/83132* (2013.01); *H01L 2224/83385* (2013.01); *H01L 2224/92125* (2013.01); *H01L 2224/92225* (2013.01); *H01L 2924/1532* (2013.01); *H01L 2924/16151* (2013.01); *H01L 2924/16251* (2013.01); *H01L 2924/19105* (2013.01)

(56) References Cited

U.S. PATENT DOCUMENTS

| | | | | |
|---|---|---|---|---|
| 6,984,889 | B2* | 1/2006 | Kimura | H01L 25/0655 257/784 |
| 7,521,799 | B2 | 4/2009 | Hayashi et al. | |
| 7,782,624 | B2 | 8/2010 | Fujii | |
| 8,058,714 | B2* | 11/2011 | Noll | H01L 23/552 257/678 |
| 9,461,001 | B1* | 10/2016 | Tsai | H02J 7/025 |
| 9,974,158 | B2* | 5/2018 | Railkar | H01L 24/17 |
| 10,483,618 | B2 | 11/2019 | Park et al. | |
| 10,910,329 | B2* | 2/2021 | Liao | H01P 5/107 |
| 2002/0074649 | A1 | 6/2002 | Chrysler et al. | |
| 2004/0195682 | A1* | 10/2004 | Kimura | H01L 23/49816 257/723 |
| 2005/0145999 | A1 | 7/2005 | Mamitsu et al. | |
| 2006/0214292 | A1 | 9/2006 | Agraharam et al. | |
| 2008/0042250 | A1 | 2/2008 | Wilson et al. | |
| 2009/0168367 | A1 | 7/2009 | Fujii | |
| 2010/0059854 | A1 | 3/2010 | Lin et al. | |
| 2011/0018114 | A1 | 1/2011 | Pagaila et al. | |
| 2011/0147929 | A1 | 6/2011 | Roy et al. | |
| 2012/0086109 | A1 | 4/2012 | Kim et al. | |
| 2012/0228780 | A1 | 9/2012 | Kim et al. | |
| 2013/0082372 | A1* | 4/2013 | Lin | H01L 25/50 438/109 |
| 2014/0035097 | A1* | 2/2014 | Lin | H01L 23/66 257/531 |
| 2014/0070368 | A1 | 3/2014 | Oyamada et al. | |
| 2014/0327129 | A1 | 11/2014 | Cho et al. | |
| 2015/0181739 | A1 | 6/2015 | Fukuda et al. | |
| 2016/0276734 | A1 | 9/2016 | Jin et al. | |
| 2017/0033062 | A1* | 2/2017 | Liu | H01L 21/486 |
| 2018/0063940 | A1* | 3/2018 | Railkar | H05K 1/0204 |
| 2018/0342470 | A1* | 11/2018 | Liao | H01L 23/66 |
| 2019/0131689 | A1 | 5/2019 | Park et al. | |

FOREIGN PATENT DOCUMENTS

| | | | |
|---|---|---|---|
| CN | 103035593 A | 4/2013 | |
| CN | 103582945 A | 2/2014 | |
| JP | 10-275883 A | 10/1998 | |
| JP | 2003-7910 A | 1/2003 | |
| JP | 2009-158742 A | 7/2009 | |
| JP | WO2014/020787 A1 | 2/2014 | |
| JP | 2016-32074 A | 3/2016 | |
| KR | 10-1998-0025624 A | 7/1998 | |
| KR | 10-2005-0000923 A | 1/2005 | |
| KR | 10-2016-0112154 A | 9/2016 | |
| TW | 541682 B * | 7/2003 | ............ H01L 23/13 |

OTHER PUBLICATIONS

Chinese Office Action dated Jan. 26, 2022 in counterpart Chinese Patent Application No. 201810115945.6 (12 pages in English, 7 pages in Chinese).

Korean Office Action dated Feb. 15, 2022 in counterpart Korean Patent Application No. 10-2017-0103390 (8 pages in English, 6 pages in Korean).

* cited by examiner

I - I'

SEMICONDUCTOR PACKAGE AND ELECTRONIC DEVICE HAVING THE SAME

CROSS-REFERENCE TO RELATED APPLICATION(S)

This application is a continuation of U.S. patent application Ser. No. 15/832,807 filed on Dec. 6, 2017, which claims benefit under 35 USC § 119(a) of Korean Patent Application No. 10-2017-0103390 filed on Aug. 16, 2017 in the Korean Intellectual Property Office, the entire disclosure of which is incorporated herein by reference for all purposes.

BACKGROUND

1. Field

The following description relates to a semiconductor package and an electronic device including the same.

2. Description of Related Art

In order to process high quality, high capacity data at high speed, a frequency band of a semiconductor package is increased. For example, in the case of a semiconductor package for wireless communications, a technology using a millimeter wave band of 27 GHz or more is considered.

Since a wavelength of a frequency is reduced to millimeters in the millimeter wave band, performance may be degraded when a conventional semiconductor package structure is used.

Therefore, a semiconductor package that operates efficiently in an ultrahigh frequency band is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor package includes, a substrate including an antenna, a heating element disposed on a first surface of the substrate and connected to the antenna, a heat radiating part coupled to the heating element, and a signal transfer part disposed on the first surface of the substrate and electrically connecting the substrate to a main substrate, wherein the heat radiating part includes a heat transfer part connected to the heating element and heat radiating terminals connecting the heat transfer part and the main substrate to each other.

The heat transfer part may have a flat plate shape or a block shape and may comprise a metal.

The semiconductor package may include connection terminals disposed on one side of the signal transfer part and connected to the main substrate, wherein the heat radiating terminal may comprise a material in common with the connection terminal and have substantially the same size as the connection terminal.

The semiconductor package may include a sealing part substantially enclosing the signal transfer part and the heating element.

The heat transfer part may be embedded in the sealing part, and the heat radiating terminal may penetrate through the sealing part and may be connected to the heat transfer part.

The heat transfer part may include one or more coupling grooves, and a portion of the sealing part may be disposed in the one or more coupling grooves.

The one or more coupling grooves may include a hole through the heat transfer part, and the one or more coupling grooves may be disposed to be distributed over an area of the heat transfer part.

The heat transfer part may include a step disposed in an edge of one surface of a first surface bonded to the heating element and a second surface bonded to the heat radiating terminal.

A portion of the heat transfer part may be exposed externally of the sealing part, and the heat radiating terminal may be connected to the portion exposed externally of the sealing part.

The heat transfer part may include a case including an internal space, and the heat radiating element may be disposed in the internal space of the case.

The case may include one or more through-holes, and the sealing part may be disposed in the internal space of the case through the through-holes.

The signal transfer part may include a connection conductor including one end connected to the substrate and another end connected to the main substrate through a connection terminal, and an insulating part enclosing the connection conductor.

The signal transfer part may include melted and cured solder balls in the sealing part.

The semiconductor package may include a bonding layer interposed between the heating element and the heat transfer part.

In one general aspect, an electronic device includes a semiconductor package including a substrate including a heating element and a signal transfer part disposed on one surface and a heat radiating part coupled to the heating element, and a main substrate wherein the semiconductor package is disposed on a first surface, wherein the heat radiating part includes a heat transfer part connected to the heating element and heat radiating terminals connecting the heat transfer part and the main substrate to each other, and the main substrate includes one or more heat radiating via connected to the heat radiating terminals.

The electronic device may include a heat radiating member coupled to a second surface of the main substrate, wherein the heat radiating via may penetrate through the main substrate and may be connected to the heat radiating member.

The electronic device may further include an antenna disposed on the substrate.

The antenna may transmit and/or receive radio signals in a millimeter wavelength band.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
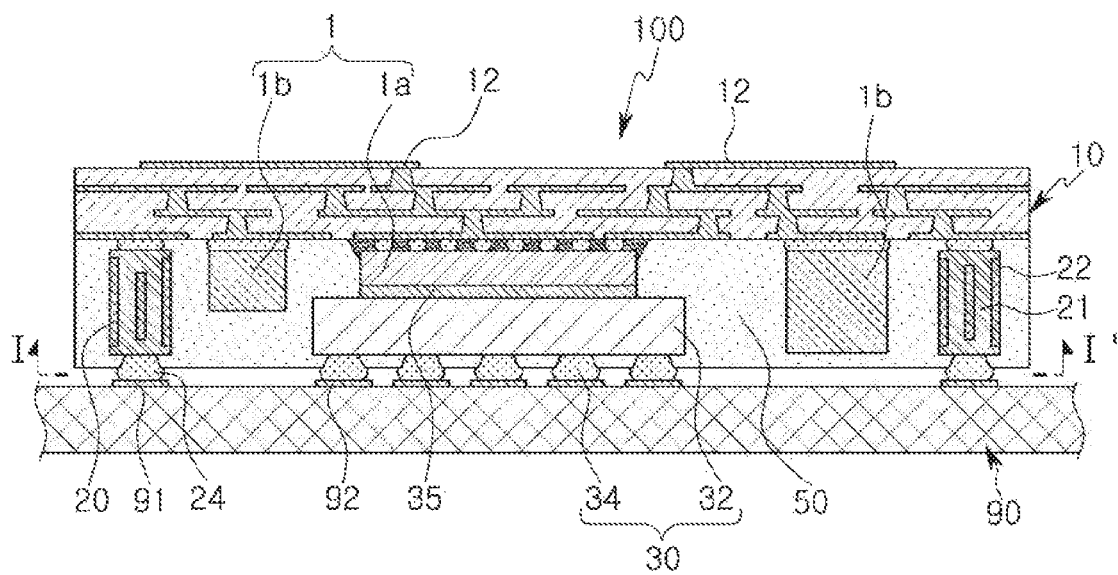
FIG. 1 is a cross-sectional view of a semiconductor package according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
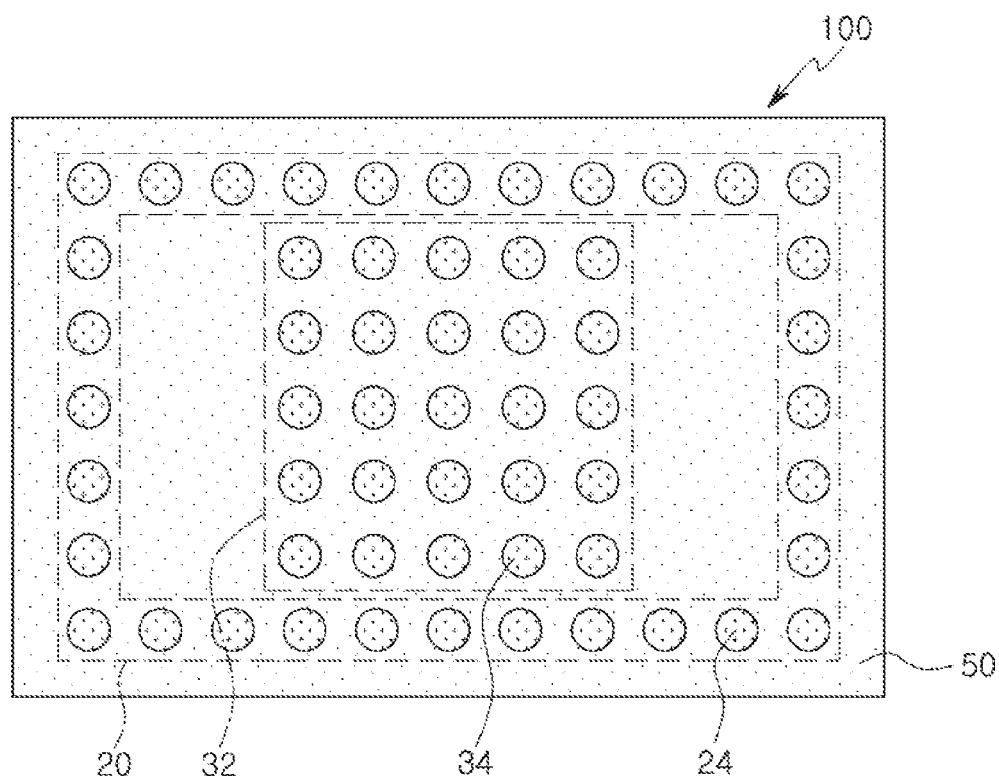
FIG. 2 is a cross-sectional view taken along a line I-I' of FIG. 1.

FIG. 1 is a cross-sectional view of a semiconductor package according to an embodiment and FIG. 2 is a cross-sectional view taken along a line I-I' of FIG. 1.

Referring to FIGS. 1 and 2, a semiconductor package 100 according to an embodiment, a semiconductor package transmitting and receiving radio signals using a millimeter wave band, includes a substrate 10, a circuit part 1, a signal transfer part 20, a sealing part 50, and a heat radiating part 30.

A substrate 10 may be a multilayer substrate formed by repeatedly stacking insulating layers and wiring layers. However, a double-sided substrate wherein the wiring layers are formed on opposite surfaces of one insulating layer may also be used as needed.

The wiring layer of the substrate 10 includes one or more antennas 12. The antennas 12 may be disposed on any one of an upper surface (a first surface) or a side surface of the substrate 10, and an inside of the substrate. Further, the antenna 12 may include at least one of a dipole antenna, a monopole antenna, and a patch antenna.

In an embodiment, the antenna 12 means a radiator, but may also be understood to include the wiring connecting the radiator and an electronic element with each other. Further, the antenna 12 according to an embodiment may radiate or receive a radio frequency (RF) signal in a millimeter (mm) wave band.

The wiring layer electrically connects the circuit part 1 and the antenna 12 with each other. The wiring layer may be formed of a metal having conductivity such as copper (Cu), nickel (Ni), aluminum (Al), silver (Ag), or gold (Au).

According to an embodiment, a distance between the circuit part 1 and the antenna 12 may be relatively shorter than in a conventional semiconductor package using a low frequency band. To this end, according to an embodiment, the antenna 12 is formed on a first surface of the substrate 10 and the circuit part 1 is mounted on a second surface of the substrate 10. As a result, signal power loss is significantly reduced and degradation in reflection characteristics is reduced.

As the substrate 10, various kinds of substrates (e.g., a printed circuit board, a flexible substrate, a ceramic substrate, a glass substrate, etc.), known in the art, may be used.

The circuit part 1 includes one or more elements and is mounted on at least one of opposite surfaces of the substrate 10. Here, the elements include both active elements and passive elements.

Further, the circuit part 1 may include at least one general element 1b and heating element 1a that generates substantial heat in operation. The heating element 1a may include an active surface on which a terminal is formed and an inactive surface, an opposite surface of the active surface, and may be mounted on the second surface on which the antenna 12 is not disposed among the surfaces of the substrate 10.

For example, in the case in which the antenna 12 is disposed on the upper surface of the substrate 10 as shown in FIG. 1, the heating element 1a may be mounted in a flip-chip bonding structure on a lower surface (a second surface) of the substrate 10. In this case, a gap between the heating element 1a and the substrate 10 may be filled with an underfill resin.

The heating element 1a may include multiple analog components (MAC), a base band signal processing circuit, or the like, but is not limited thereto.

The signal transfer part 20 is disposed on the second surface on which the circuit part 1 is disposed among the opposite surfaces of the substrate 10 and have a mounting height higher than the circuit part 1. Therefore, the signal transfer part 20 protrudes further downward from the substrate 10 as compared to the circuit part 1.

Further, the signal transfer part 20 includes a connection conductor 21 having one end, electrically connected to the substrate 10, and an insulating part 22 protecting the connection conductor 21.

The connection conductor 21 is disposed in the sealing part 50 so as to penetrate through the sealing part 50 and have one end bonded to the substrate 10 and the other end connected to a connection terminal 24. Therefore, the connection conductor 21 may be formed to have various forms as long as it electrically connects between the substrate 10 and the connection terminal 24.

The connection conductor 21 may be formed of a conductive material and may be formed of, for example, copper, gold, silver, aluminum, or alloys thereof.

The insulating part 22 is disposed on a surface of the connection conductor 21 to protect the connection conductor 21. Therefore, the insulating part 22 may embed the connection conductor 21 and expose only opposite end portions of the connection conductor 21 to the outside. The insulating part 22 may be formed of an insulation resin material. However, the insulating part 22 is not limited thereto.

As the signal transfer part 20 configured as described above, for example, a printed circuit board (PCB) may be used, or the signal transfer part 20 may be configured in a form similar thereto. However, the signal transfer part 20 is not limited thereto, but may be variously modified as in embodiments to be described below.

Meanwhile, since the signal transfer part 20 is embedded in the sealing part 50 according to an embodiment, the sealing part 50 may also serve as the insulating part 22. Therefore, the signal transfer part 20 may also include only the connection conductor 21 while the insulating part 22 can be omitted as needed.

The connection terminal 24 may be coupled to the other end of the connection conductor 21.

When the semiconductor package 100 is mounted on the main substrate 90, the connection terminal 24 physically and electrically connects the semiconductor package 100 and the main substrate 90 with each other. The connection terminal 24 may be formed of a conductive adhesive such as a solder, but is not limited thereto.

Meanwhile, as shown in FIG. 2, the signal transfer part 20 according to an embodiment is formed in a shape of a quadrangular ring along an outline of the substrate 10. However, the configuration of present disclosure is not limited thereto, but may be variously modified.

Figure 3:
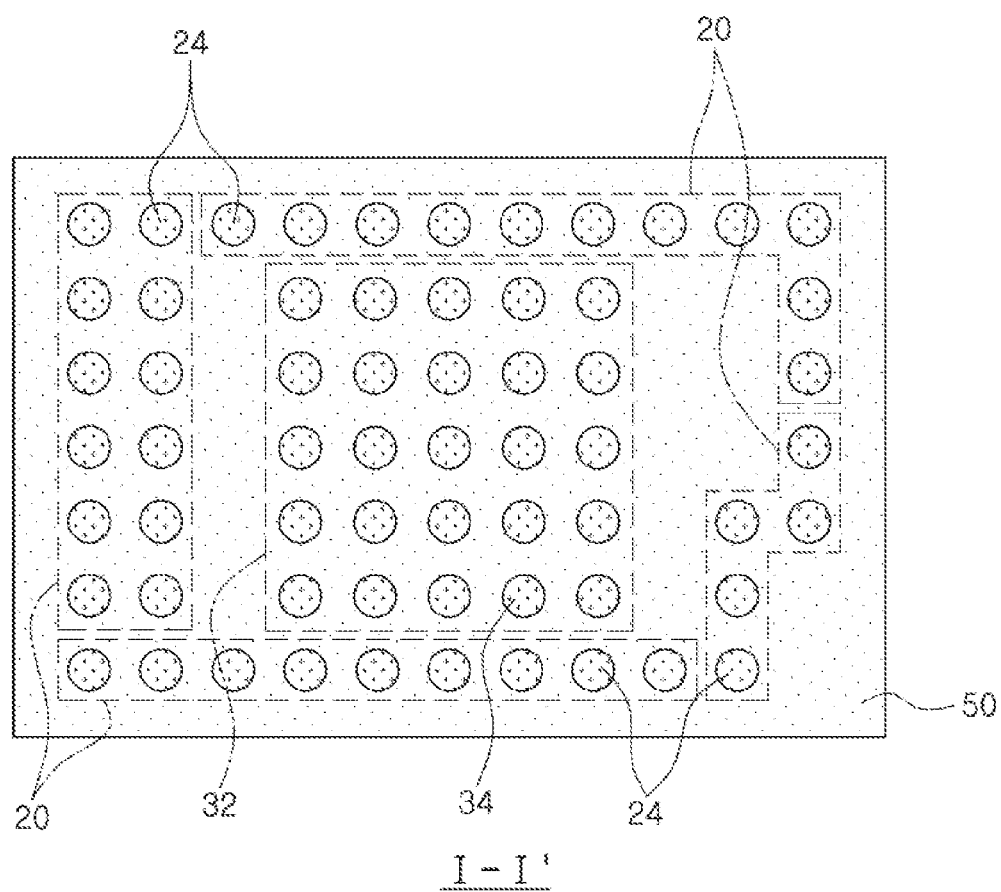
FIG. 3 is a view of a modified example of a signal transfer part shown in FIG. 2.

FIG. 3 is a view of a modified example of the signal transfer part shown in FIG. 2.

Referring to FIG. 3, the signal transfer part 20 may be formed in a bar shape, or may be formed in a curved linear shape. Further, the signal transfer part 20 may also be formed in a block shape in which the connection terminals 24 are arranged in columns. However, the signal transfer part 20 may be variously modified and for example, may be formed in a circular shape, an oval shape, or an irregular shape.

Referring again to FIGS. 1 and 2, the heat radiating part 30 will be described.

The heat radiating part 30 is coupled to the inactive surface of the heating element 1a to radiate heat generated from the heating element 1a to the outside.

To this end, the heat radiating part 30 includes a heat transfer part 32 and a heat radiating terminal 34.

The heat transfer part 32 may be formed in a flat plate form or a block form and a first surface thereof may be bonded to the inactive surface of the heating element 1a. In addition, one or more heat radiating terminals 34 may be bonded to a second surface of the heat transfer part 32.

Accordingly, the heat conducted to the first surface of the heat transfer part 32 from the heating element 1a may be transferred to the heat radiating terminal 34 through the second surface of the heat transfer part 32.

The heat transfer part 32 may be formed of various materials as long as the materials have high heat conductivity. For example, the heat transfer part 32 may be formed of a metal member and may be formed of a material such as copper (Cu), nickel (Ni), titanium (Ti), gold (Au), tin (Sn), or the like. However, the material of the heat transfer part 32 is not limited thereto, but a non-metal having heat conductivity, such as graphite, may also be used.

The heat transfer part 32 may be bonded to the heating element 1a through a bonding layer 35.

The bonding layer 35 may be formed by coating the inactive surface of the heating element 1a or the first surface of the heat transfer part 32 with a resin based adhesive such as an epoxy. In this case, the bonding layer 35 is formed of a non-conductive material.

However, the material of the bonding layer 35 is not limited thereto, but the bonding layer 35 may also be formed by forming a metal thin film layer on the inactive surface. In this case, the heat transfer part 32 may be bonded to the bonding layer 35 by a method such as a soldering or the like.

Meanwhile, when the heat transfer part 32 has adhesive properties, the bonding layer may be omitted.

According to an embodiment, the heat transfer part 32 is formed in a form of a quadrangular flat plate and may have an area wider than that of the inactive surface of the heating element 1a. However, a shape or a size of the heat transfer part 32 is not limited thereto, but may be variously modified as needed.

The heat radiating terminals 34 may be bonded to the second surface of the heat transfer part 32.

The heat radiating terminals 34 may be formed of the same material as the connection terminals 24. Accordingly, the heat radiating terminals 34 may be collectively bonded to the main substrate 90 together with the connection terminals 24 in a manufacturing process.

Further, the heat radiating terminal 34 and the connection terminal 24 may be formed by the same method by using the same member. For example, the heat radiating terminal 34 and the connection terminal 24 may be formed by each bonding a solder ball formed in the same size to the connection conductor 21 and the heat transfer part 32. Therefore, the heat radiating terminals 34 may be formed to have the same or similar size as the connection terminals 24.

The sealing part 50 may be formed on the second surface of the substrate 10. Therefore, the sealing part 50 is disposed to embed the circuit part 1 and the signal transfer part 20 which are mounted on the second surface of the substrate 10.

The sealing part 50 is filled between the respective elements 1a and 1b configuring the circuit part 1 to thereby prevent an occurrence of an electrical short circuit between the elements 1a and 1b, to enclose the outer portions of the elements 1a and 1b, to fix the elements 1a and 1b onto the substrate 10, and to safely protect the elements 1a and 1b from external shock.

Further, the sealing part 50 embeds the signal transfer part 20 to thereby firmly fix the signal transfer part 20 to the substrate 10 and to protect the signal transfer part 20 from external shocks.

As the sealing part 50 is formed, only the connection terminals 24 and the heat radiating terminals 34 may be exposed externally of the sealing part 50 from the lower surface of the semiconductor package 100 as shown in FIG. 2.

The sealing part 50 may be formed of an insulation material. According to an embodiment, an epoxy molding compound (EMC) may be used, but the material of the sealing part 50 is not limited thereto.

Meanwhile, the main substrate 90 shown in FIG. 1, a substrate on which the semiconductor package 100 is mounted, may refer to a circuit board included in various applications (e.g., a portable terminal, a computer, a laptop, a TV, and the like). Therefore, as the main substrate 90, various known substrates such as a printed circuit board, a flexible substrate, a ceramic substrate, a glass substrate, and the like may be used.

Electrode pads 91 and 92 may be formed on the first surface of the main substrate 90. The electrode pads 91 and 92 include a signal pad 91 connected to the connection terminals 24, and the heat radiating pad 92 connected to the heat radiating terminals 34.

Next, a method for manufacturing a semiconductor package according to an embodiment will be described.

Figure 4:
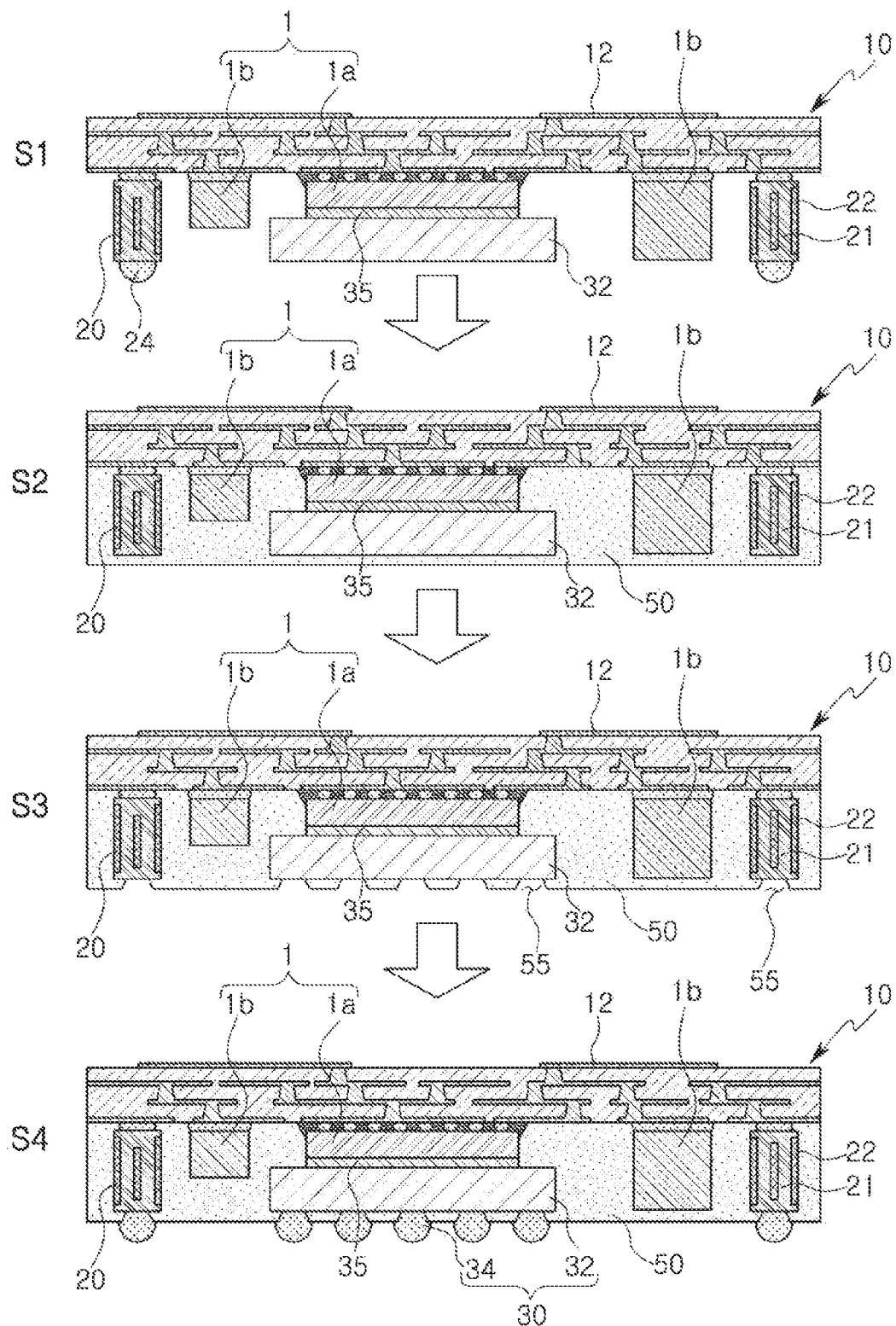
FIG. 4 is a view of a method for manufacturing the semiconductor package shown in FIG. 1.

FIG. 4 shows a method for manufacturing a semiconductor package illustrated in FIG. 1.

Referring to FIG. 4, in a semiconductor package according to an embodiment, first, the circuit part 1 is formed on the second surface of the substrate 10 including the antenna 12 and the signal transfer part 20 is disposed on the second surface of the substrate 10 (S1). The circuit part 1 and the signal transfer part 20 are collectively mounted on the substrate 10 through a conductive adhesive such as a solder.

In addition, the heat transfer part 32 is disposed on the inactive surface of the heating element 1a. As described above, the heat transfer part 32 is bonded to the heating element 1a through the bonding layer 35.

Next, the sealing part 50 that embeds the entirety of the circuit part 1 and the signal transfer part 20 is formed (S2). The sealing part 50 may be formed by transfer-molding the EMC, but is not limited thereto.

Next, a via hole 55 is formed so that the connection terminal 24 and a portion of the signal transfer part 20 are exposed (S3). The via hole 55 may be formed using laser drilling. Therefore, the via hole 55 may be formed in a conical shape having a smaller cross-sectional area toward the bottom.

Next, the semiconductor package 100 may be completed by forming the connection terminal 24 and the heat radiating terminal 34 in the via hole 55. The connection terminal 24 and the heat radiating terminal 34 are each bonded to the connection conductor 21 and the heat transfer part 32 by disposing the solder ball in the via hole 55 and then melting and curing the disposed solder ball.

The semiconductor package 100 according to an embodiment configured as described above radiates heat from the heating element 1a to the main substrate 90 through the heat transfer part 32 and the heat radiating terminals 34. Therefore, heat radiating characteristics of the semiconductor package may be improved as compared to the related art.

Meanwhile, the semiconductor package according to the description is not limited to the embodiments described above, but may be variously modified.

Figure 5:
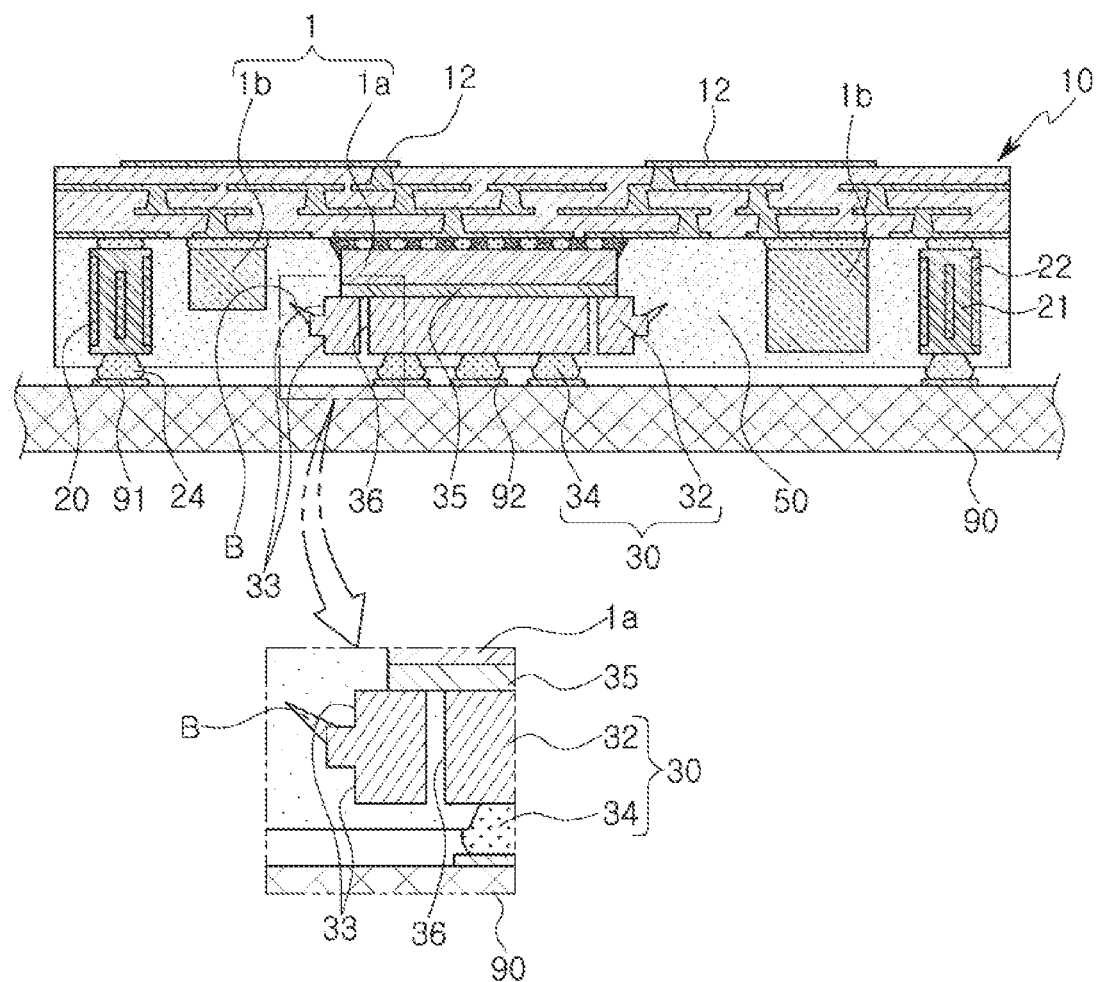
FIG. 5 is a view of a modified example of a heat transfer part shown in FIG. 2.

FIG. 5 is a view illustrating a modified example of the heat transfer part illustrated in FIG. 2.

Referring to FIG. 5, the heat transfer part 32 may have a step 33 formed along an edge of the first surface in contact with the bonding layer 35.

Such a step 33 is provided to significantly reduce an influence of a burr B generated in a process of manufacturing the heat transfer part 32.

The heat transfer part 32 may be formed by various methods, for example, by a press processing. In this case, the burr B may be formed in an edge portion of the first surface of the heat transfer part 32.

In the case in which the burr B is formed as described above, since a degree of precision is decreased due to interruption with the burr B in the process of coating the bonding layer 35 onto the heat transfer part 32, a problem in reliability may occur.

Therefore, according to an embodiment, the heat transfer part 32 is manufactured by first forming the step 33 in the edge portion by the press processing and then performing a cutting process. In this case, since the burr B is positioned within a thickness range of the step 33 as illustrated in FIG. 5, the interruption with the burr B does not occur in the process of coating the bonding layer 35 on the first surface of the heat transfer part 32.

Meanwhile, the present embodiment illustrated in FIG. 5 illustrates a case in which the steps 33 are formed in both the first surface and the second surface of the heat transfer part 32 by way of example. However, the position of the step 33 is not limited thereto, but the step may also be formed in only one surface of the first surface and the second surface in which the burr B is formed.

Further, according to an embodiment, the heat transfer part 32 includes one or more coupling grooves 36.

The coupling groove 36 may have a hole form penetrating through the heat transfer part 32 and may be filled with the sealing part 50. Thereby, the heat transfer part 32 may be more firmly coupled to the sealing part 50.

The coupling groove 36 may be used as a fiducial mark, when the heat transfer part 32 is bonded to the heating element 1a. Therefore, in the process of manufacturing the semiconductor package, the heat transfer part 32 and the heating element 1a may be more precisely coupled to each other.

Meanwhile, in a case in which the coupling groove 36 is not used as the fiducial mark, the coupling groove 36 may be formed in a form of a groove, not a through-hole.

The coupling groove 36 is formed in each tip portion of the heat transfer part 32. However, the coupling groove 36 is not limited thereto, but may be disposed in various positions as needed, and a plurality of coupling grooves may be provided, depending on a thickness or an area of the heat transfer part 32. For example, the coupling grooves can be distributed over the entire area of the heat transfer part or over a part of the area of the heat transfer part.

Figure 6:
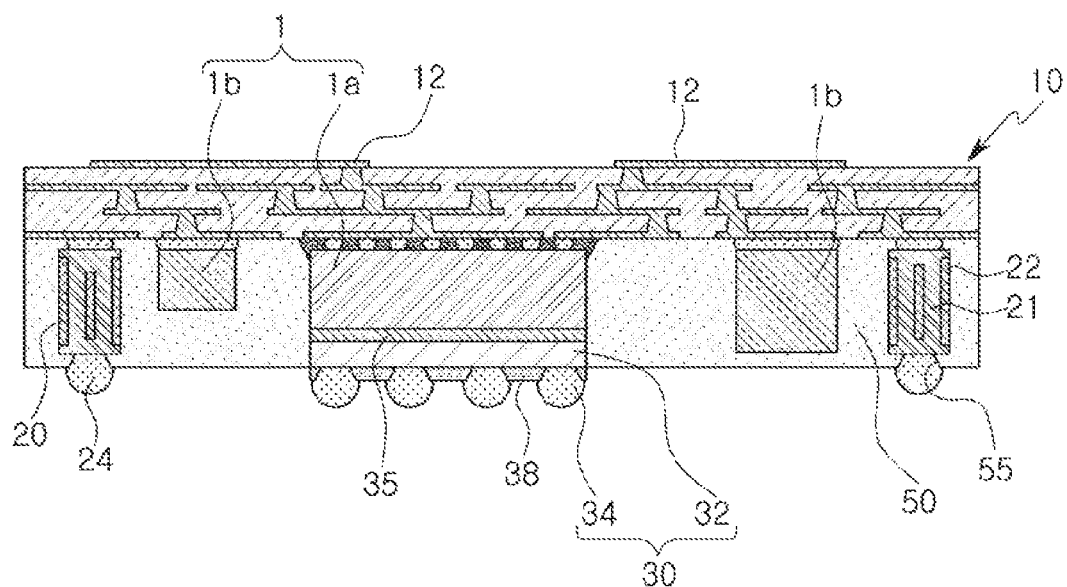
FIGS. 6 through 9 are cross-sectional views of each of semiconductor packages according to embodiments.
Figure 7:
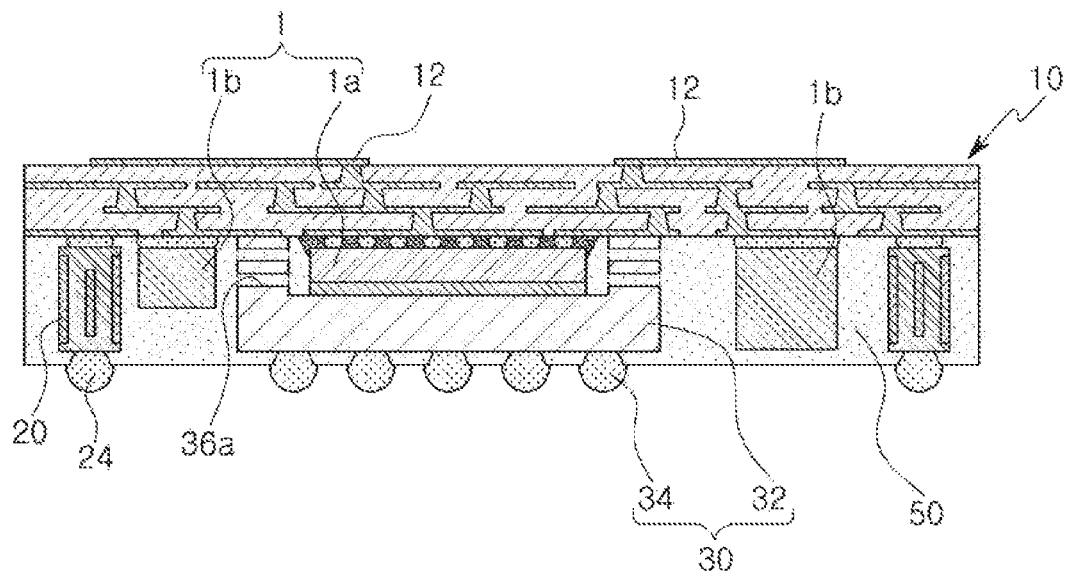
Figure 8:
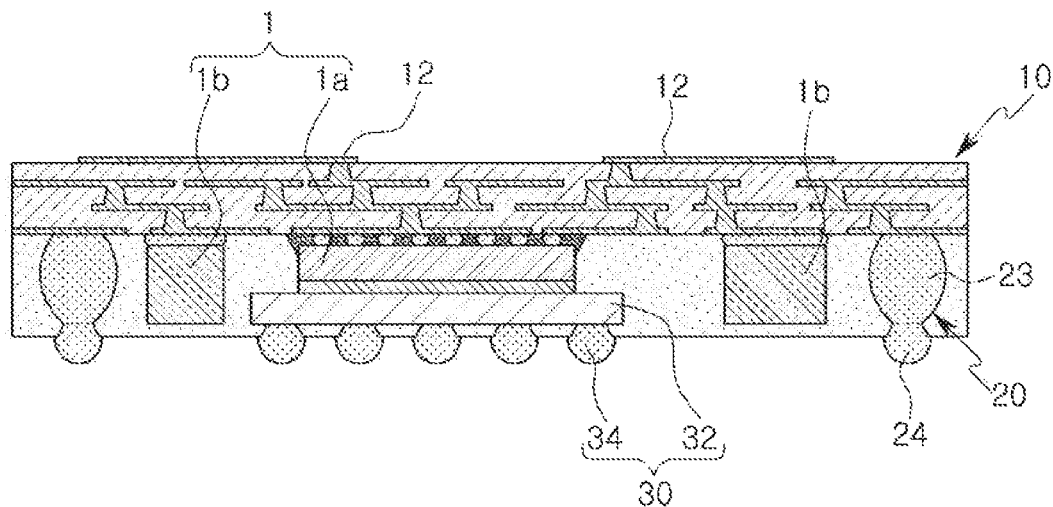

FIGS. 6 through 8 are cross-sectional views of each of semiconductor packages according to embodiments.

Referring first to FIG. 6, in the semiconductor package according to an embodiment, the heat transfer part 32 may be formed to have the same or a similar area to that of the inactive surface of the heating element 1a.

Further, the heating element is according to an embodiment may be the element having a thickness thicker than the embodiment described above. Thereby, the heat transfer part 32 has a thickness that is thinner than the embodiment described above.

In an example in which the heat transfer part 32 needs to be formed to have a thin thickness, the heat transfer part 32 is formed on the inactive surface of the heating element 1a by a method such as depositing or plating, but is not limited thereto.

Further, a portion of the heat transfer part 32 according to an embodiment may be exposed externally of the sealing part 50. Therefore, heat radiating terminals 34 are disposed at the portion that the heat transfer part 32 is exposed externally of the sealing part 50.

In the semiconductor package according to an embodiment, the entirety of the second surface of the heat transfer part 32 to which a heat radiating terminal 34 is bonded is exposed externally of the sealing part 50. However, various modifications are possible. For example, after the step is formed in the second surface of the heat transfer part 32, only a portion of the second surface may be exposed.

Meanwhile, in an example in which the heat radiating terminal 34 is bonded to the exposed second surface of the heat transfer part 32, the heat radiating terminal 34 may melt in the process of bonding the heat radiating terminal 34 to the heat transfer part 32 and may be diffused along the second surface of the heat transfer part 32. In this case, it is difficult for the heat radiating terminal 34 to maintain a shape of a ball illustrated in FIG. 6.

Therefore, the semiconductor package according to an embodiment includes the insulating layer 38 defining the position of the heat radiating terminal 34 on the second surface of the heat transfer part 32. The insulating layer 38 is disposed substantially on the entirety of the second surface of the heat transfer part 32 exposed to the outside, and is formed in a form in which only the portion in which the heat radiating terminal 34 is formed is removed, and for example, may be formed of a solder resist.

Therefore, the method for manufacturing the semiconductor package according to an embodiment includes an operation of forming the sealing part 50 to completely embed the signal transfer part 20 and the heat transfer part 32 and then removing a portion of the sealing part 50 so that the second surface of the heat transfer part 32 is exposed. This may be performed by a polishing operation.

In addition, the semiconductor package may be completed by performing an operation of forming the insulating layer 38 where the portion on which the heat radiating terminal 34 is formed is removed on the second surface of the heat transfer part 32, an operation of forming the via hole 55 in the sealing part 50, and an operation of bonding the connection terminal 24 and the heat radiating terminal 34 to the signal transfer part 20 and the heat transfer part 32. Here, the operation of forming the via hole 55 may precede the operation of forming the insulating layer 38 as needed.

Referring to FIG. 7, in the semiconductor package according to an embodiment, the heat transfer part 32 is formed in a cap form. In more detail, the heat transfer part 32 is formed in a bowl form including an internal space and is coupled to the heating element 1a in a form accommodating the heating element 1a in the internal space.

Accordingly, the inactive surface of the heating element 1a is bonded to a bottom surface of the internal space of the heat transfer part 32.

A side wall of the heat transfer part 32 may be bonded to the substrate 10. However, the side wall of the heat transfer part 32 is not limited thereto, but may also be configured to be spaced apart from the substrate 10 as needed. The term "spaced apart" as used herein, can generally mean not in contact with.

Further, one or more through-holes 36a are formed in the heat transfer part 32. The through-holes 36a are provided to dispose the sealing part 50 in the internal space of the heat transfer part 32. As the through-holes 36a are provided, a melted resin, a raw material of the sealing part 50, is introduced into the internal space of the heat transfer part 32 through the through-hole in a process of manufacturing the sealing part 50, thereby filling the internal space of the heat transfer part 32.

Meanwhile, although not illustrated, similarly to the case described above of FIG. 6, the heat transfer part 32 according to an embodiment may also be exposed externally of the sealing part 50.

Referring to FIG. 8, the semiconductor package according to an embodiment may configure the signal transfer part 20 using the conductive member 23 such as a solder ball. In this case, the signal transfer part 20 is not integrally formed and conductive members are disposed to be spaced apart from each other. Further, costs for manufacturing the signal transfer part 20 are reduced.

In the method for manufacturing the semiconductor package according to an embodiment, after the conductive members 23 which are separately manufactured are mounted on the second surface of the substrate 10, the sealing part 50 enclosing the conductive members 23 is formed. Here, since a space is formed between the conductive members 23 as the conductive members 23 are disposed to be spaced apart from each other, the melted resin, the raw material of the sealing part 50, easily flow through such a space. Therefore, the sealing part 50 is easily manufactured.

The subsequent manufacturing process may be performed in a similar manner to the embodiments described above.

Figure 9:
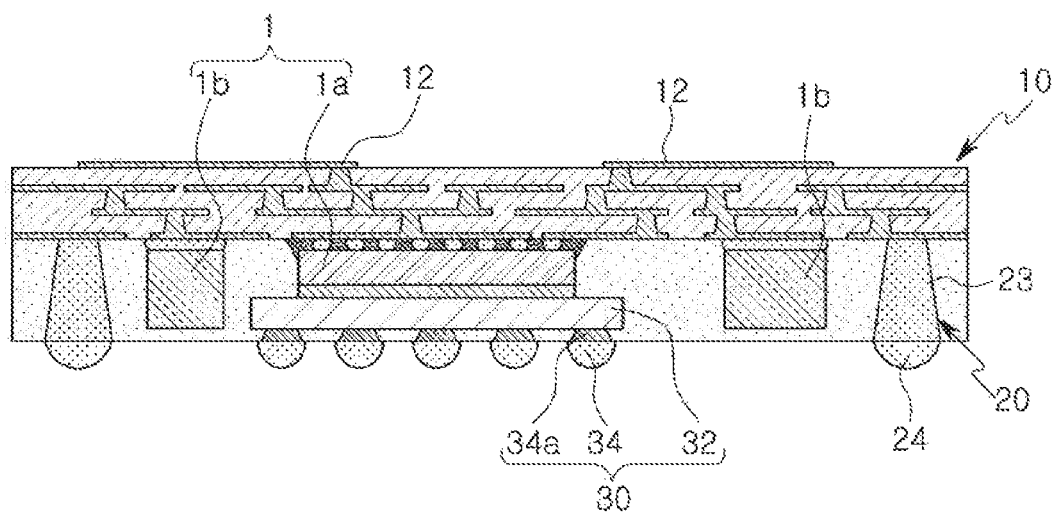

However, the method for manufacturing the semiconductor package according to the description is not limited to the above-mentioned method, but as illustrated in FIG. 9, the conductive members 23 may also be manufactured by first forming the sealing part 50 on the second surface of the substrate 10, forming the via hole that perfectly penetrates through the sealing part 50, and then filling the conductive material in the via hole. In this case, the via hole may be formed using laser drilling, and the conductive material may be filled in the via hole in a form of paste and be then melted and cured, or may be formed in the via hole by a plating manner.

Further, in the semiconductor package illustrated in FIG. 9, the heat radiating terminal 34 is not directly bonded to the heat transfer part 32, but after a heat radiating via 34a penetrating through the sealing part 50 is disposed, the heat radiating terminal 34 is bonded to the heat radiating via 34a.

The heat radiating via 34a may be simultaneously formed in the operation of forming the conductive members 23. Further, the heat radiating terminal 34 may be simultaneously bonded to the heat radiating via 34a in the operation of bonding the connection terminal 24 to the conductive member 23.

Meanwhile, although not illustrated, the pad may be formed on a bonded surface of the heat radiating via 34a to which the heat radiating terminal 34 is bonded. Further, the heat radiating terminal 34 and the heat radiating via 34a may be formed of the same material, but are not limited thereto.

Figure 10:
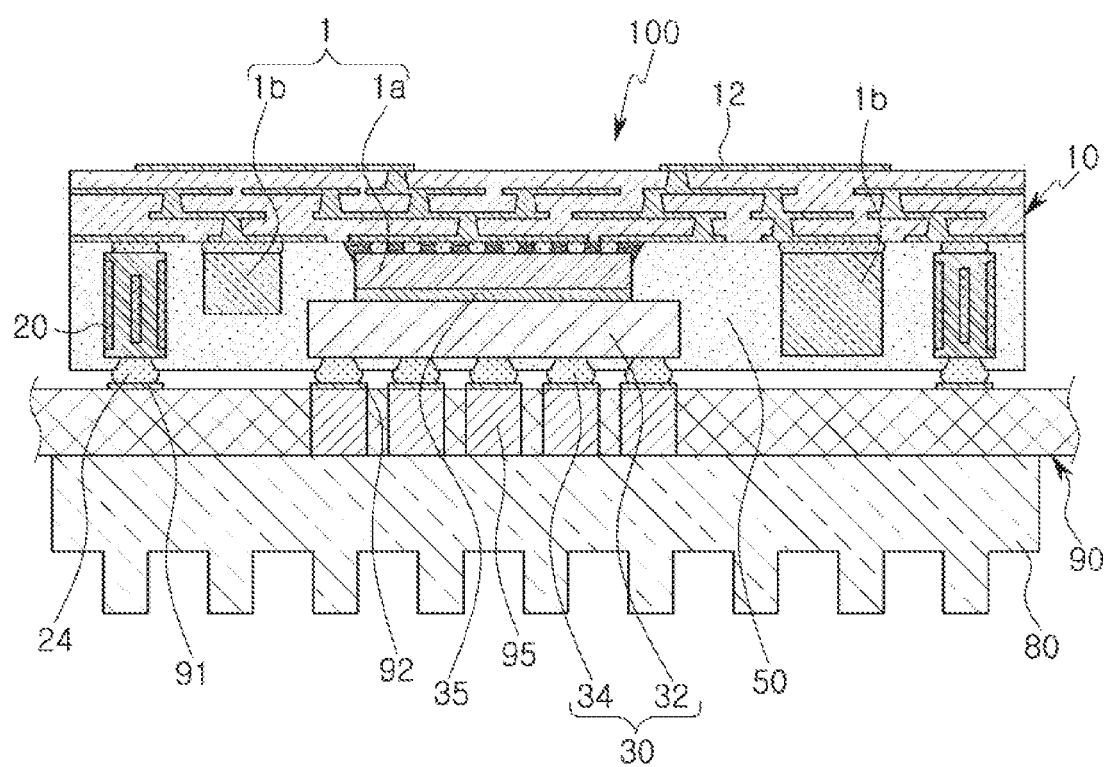
FIG. 10 is a view of an electronic device according to an embodiment.

FIG. 10 is a view schematically illustrating an electronic device according to an embodiment.

Referring to FIG. 10, in the electronic device according to an embodiment, the semiconductor package 100 illustrated in FIG. 1 is mounted on the main substrate 90. However, the electronic device is not limited thereto, and the semiconductor package described in other embodiments may also be used.

The main substrate 90, the substrate on which the semiconductor package 100 is mounted as described above, may refer to a circuit board included in the applications (e.g., a portable terminal, a computer, a laptop, a TV, and the like). Therefore, as the main substrate 90, various known substrates such as a printed circuit board, a flexible substrate, a ceramic substrate, a glass substrate, and the like may be used.

Electrode pads 91 and 92 are formed on the first surface of the main substrate 90. The electrode pads 91 and 92 include a signal pad 91 connected to the connection terminals 24 and the heat radiating pad 92 connected to the heat radiating terminals 34.

Further, one or more heat radiating vias 95 are disposed in the main substrate 90.

The heat radiating via 95 is disposed to penetrate through the main substrate 90 and have one end connected to the heat radiating pad 92. In addition, the other end of the heat radiating via 95 is exposed to the second surface of the main substrate 90 and connected to the heat radiating member 80.

The heat radiating member 80 is coupled to the second surface of the main substrate 90 and connected to the heat radiating via 95. Accordingly, the heat transferred from the heat radiating via 95 is discharged to the outside through the heat radiating member 80.

As the heat radiating member 80, a heat sink may be used, but the heat radiating member is not limited thereto. Further, the heat radiating member 80 may be omitted as needed.

For example, in a case in which the heating element is electrically connected to the substrate through a bonding wire, the heat transfer part may be bonded to the active surface of the heating element.

Further, the embodiments described above may be combined with each other. For example, the conductive member illustrated in FIG. 8 may be all applied to the semiconductor packages disclosed in other embodiments.

As set forth above, according to embodiments, the semiconductor package and the electronic device having the same may radiate the heat of the heating element to the main substrate through the heat transfer part and the heat radiating terminals. Therefore, heat radiating characteristics of the semiconductor package are improved as compared to the related art.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
   a substrate, comprising a wiring layer;
   a heating element, disposed on a first surface of the substrate and connected to the wiring layer;
   a heat radiating part coupled to the heating element;
   a signal transfer part, configured to electrically connect the substrate to a main substrate;
   at least one general element, disposed on the first surface of the substrate, and having a mounting height, from the first surface of the substrate, higher than a height of the heating element; and
   a sealing part, filled between the signal transfer part, the heating element, and the at least one general element, and configured to enclose the signal transfer part and the heating element,
   wherein the heat radiating part comprises a heat transfer part connected to the heating element and a plurality of heat radiating terminals spaced apart from each other and configured to connect the heat transfer part and the main substrate to each other,
   wherein each of the plurality of heat radiating terminals comprises a first portion enclosed by the sealing part and a second portion exposed onto a surface of the sealing part and contacting a heat radiating pad disposed on the main substrate,
   wherein the sealing part consists of a single insulating material,
   wherein the signal transfer part comprises a connection conductor comprising one end connected to the substrate and another end connected to the main substrate through a connection terminal, and an insulating part enclosing the connection conductor, and
   wherein the semiconductor package further comprises a bonding layer interposed between the heating element and the heat transfer part.

2. The semiconductor package of claim 1, wherein the heat transfer part has a flat plate shape or a block shape and comprises a metal.

3. The semiconductor package of claim 1, further comprising connection terminals disposed on one side of the signal transfer part and connected to the main substrate,
   wherein the heat radiating terminal comprises a material in common with the connection terminal and has substantially the same size as the connection terminal.

4. The semiconductor package of claim 1, wherein the single insulating material is epoxy molding compound (EMC).

5. The semiconductor package of claim 1, wherein the heat transfer part is embedded in the sealing part, and the heat radiating terminal penetrates through the sealing part and is connected to the heat transfer part.

6. The semiconductor package of claim 5, wherein the heat transfer part comprises one or more coupling grooves, and a portion of the sealing part is disposed in the one or more coupling grooves.

7. The semiconductor package of claim 6, wherein the one or more coupling grooves comprise a hole penetrating through the heat transfer part, and the one or more coupling grooves are disposed to be distributed over an area of the heat transfer part.

8. The semiconductor package of claim 2, wherein the heat transfer part comprises a step disposed in an edge of at least one surface of a first surface bonded to the heating element and a second surface bonded to the heat radiating terminal of the heat transfer part.

9. The semiconductor package of claim 4, wherein a portion of the heat transfer part is exposed externally of the sealing part, and the heat radiating terminal is connected to the portion of the heat transfer part exposed externally of the sealing part.

10. The semiconductor package of claim 4, wherein the heat transfer part comprises a case comprising an internal space, and the heating element is disposed in the internal space of the case.

11. The semiconductor package of claim 10, wherein the case includes one or more through-holes, and the sealing part is disposed in the internal space of the case through the through-holes.

12. The semiconductor package of claim 4, wherein the signal transfer part comprises melted and cured solder balls in the sealing part.

13. The semiconductor package of claim 4, wherein a surface area of the heat transfer part facing the heating element is wider than a surface area of the heating element facing the heat transfer part.

14. The semiconductor package of claim 1, wherein the sealing part is disposed between the substrate and the main substrate.

15. The semiconductor package of claim 1, wherein the general element is at least one of an active element and a passive element.

* * * * *